United States Patent
Hsu et al.

(10) Patent No.: US 7,615,708 B2
(45) Date of Patent: Nov. 10, 2009

(54) ARRANGEMENT OF NON-SIGNAL THROUGH VIAS AND WIRING BOARD APPLYING THE SAME

(75) Inventors: Hsing-Chou Hsu, Hsin-Tien (TW); Ying-Ni Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 611 days.

(21) Appl. No.: 11/443,785

(22) Filed: May 30, 2006

(65) Prior Publication Data

US 2007/0194432 A1    Aug. 23, 2007

(30) Foreign Application Priority Data

Feb. 23, 2006    (TW) ................. 95106041 A

(51) Int. Cl.
*H05K 1/11*    (2006.01)
(52) U.S. Cl. ............... 174/262; 174/261; 174/265; 174/266; 361/767; 361/780; 361/808; 361/794; 361/795
(58) Field of Classification Search ......... 174/260–266; 361/767, 780, 808, 794, 795, 803
See application file for complete search history.

(56) References Cited

U.S. PATENT DOCUMENTS

| | | | |
|---|---|---|---|
| 2003/0179556 A1* | 9/2003 | Zhao et al. ................. | 361/760 |
| 2003/0183419 A1* | 10/2003 | Miller et al. ............... | 174/261 |
| 2005/0161254 A1* | 7/2005 | Clink et al. ................ | 174/262 |
| 2006/0137905 A1* | 6/2006 | Kariya et al. .............. | 174/255 |
| 2006/0175083 A1* | 8/2006 | Muramatsu et al. ........ | 174/260 |
| 2006/0202322 A1* | 9/2006 | Kariya et al. .............. | 257/698 |
| 2006/0219427 A1* | 10/2006 | Haridass et al. ........... | 174/255 |
| 2007/0029106 A1* | 2/2007 | Kato ......................... | 174/255 |
| 2007/0034405 A1* | 2/2007 | Brown ....................... | 174/262 |
| 2008/0277152 A1* | 11/2008 | Watanabe .................. | 174/262 |

* cited by examiner

*Primary Examiner*—Dean A. Reichard
*Assistant Examiner*—Hoa C Nguyen
(74) *Attorney, Agent, or Firm*—J.C. Patents

(57) ABSTRACT

An arrangement of non-signal through vias suitable for a wiring board is provided. The wiring board has a contact surface, a core layer and pads. The contact pads are disposed on the contact surface, while the arrangement of non-signal through vias includes first non-signal through vias and a second non-signal through via. The first non-signal through vias pass through the core layer and are electrically connected to some of the contact pads. The second non-signal through via which passes through the core layer is disposed between the first non-signal through vias and is not electrically connected to the contact pads. The interval between the second non-signal through via and anyone of the surrounding first non-signal through vias is smaller than or equal to 0.72 times of the minimum interval between any two of the contact pads electrically connected to the corresponding first non-signal through vias.

20 Claims, 4 Drawing Sheets

ARRANGEMENT OF NON-SIGNAL THROUGH VIAS AND WIRING BOARD APPLYING THE SAME

CROSS-REFERENCE TO RELATED APPLICATION

This application claims the priority benefit of Taiwan application Ser. No. 95106041, filed on Feb. 23, 2006. All disclosure of the Taiwan application is incorporated herein by reference.

BACKGROUND OF THE INVENTION

1. Field of Invention

The present invention relates to an arrangement of through vias (or through holes) of a wiring board, and particularly to an arrangement of non-signal through vias and a wiring board applying the same.

2. Description of the Related Art

A conventional wiring board for carrying and electrically connecting a plurality of electronic components is usually formed by a plurality of patterned conductive layers and a plurality of insulation layers disposed in an alternately overlapping manner. Each of the patterned conductive layers is made of a copper foil and defined by lithography and etching processes, and the insulation layers are disposed between two adjacent patterned conductive layers, respectively, for isolating the patterned conductive layers. The patterned conductive layers which alternately overlapped with each other are electrically connected to each other through conductive vias or conductive through vias (or "through vias" for simplicity). In addition, various electronic components (such as active components or passive components) can also be disposed on the surface of the wiring board, and internal circuits in the wiring board are used to achieve the object of electrical signal propagation.

Referring to FIG. 1, it is a cross-sectional view of a conventional wiring board. A conventional wiring board 100 includes a plurality of insulation layers 110, a plurality of patterned conductive layers 120, a plurality of through vias 130, a plurality of conductive vias 140 and a plurality of contact pads 150. One of the insulation layers 110 is a core layer 110(a). The through vias 130 include signal through vias, power through vias and ground through vias. The through vias 130 also pass through the core layer 110(a) and electrically connect some of the contact pads 150. Each of the conductive vias 140 passes through at least one of the insulation layers 110 except for the core layer 110(a). The patterned conductive layers 120 and the insulation layers 110 are alternately disposed with each other, and at least two of the patterned conductive layers 120 are electrically connected to each other through the through vias 130 and at least one of the conductive vias 140.

The disposition manner and the disposition quantity of the power through vias (or the ground through vias) among the through vias 130 are determined by the design requirement and the current carrying ability of the circuit between the power through vias (or the ground through vias) and the corresponding contact pads 150 electrically connected thereto. However, a certain number of the power through vias (or the ground through vias) among the through vias 130 in a conventional wiring board 100 are usually adjacent to each other and aggregated in the core layer 110(a) based on a circuit design consideration. Thus, for the conventional wiring board 100 to transmit current by means of the power through vias (or the ground through vias), a significant parasitic inductance would be produced. This results in a serious noise interference during switching currents.

SUMMARY OF THE INVENTION

The present invention provides an arrangement of non-signal through vias suitable for a wiring board. The wiring board has a contact surface, a core layer and a plurality of contact pads, wherein the contact pads are disposed on the contact surface. The arrangement of non-signal through vias includes a plurality of first non-signal through vias and a second non-signal through via. The first non-signal through vias pass through the core layer and are electrically connected to some of the contact pads. The second non-signal through via which passes through the core layer is disposed between the first non-signal through vias and does not electrically connect the contact pads. The interval between the second non-signal through via and anyone of the surrounding first non-signal through vias is smaller than or equal to 0.72 times of the minimum interval between any two of the contact pads electrically connected to the corresponding first non-signal through vias.

The present invention provides a wiring board, which includes a core layer, a plurality of contact pads and at least an arrangement of non-signal through vias. The contact pads are disposed over a side of the core layer. The arrangement of non-signal through vias includes a plurality of first non-signal through vias and a second non-signal through via. The first non-signal through vias pass through the core layer and are electrically connected to some of the contact pads. The second non-signal through via which passes through the core layer is disposed between the first non-signal through vias and does not electrically connect the contact pads. The interval between the second non-signal through via and anyone of the surrounding first non-signal through vias is smaller than or equal to 0.72 times of the minimum interval between any two of the contact pads electrically connected to the corresponding first non-signal through vias.

The present invention provides a chip package, which includes a wiring board and a chip. The wiring board includes a core layer, a plurality of contact pads and at least an arrangement of non-signal through vias. The contact pads are disposed over a side of the core layer. The arrangement of non-signal through vias includes a plurality of first non-signal through vias and a second non-signal through via. The first non-signal through vias which pass through the core layer are electrically connected to some of the contact pads. The second non-signal through via which passes through the core layer is disposed between the first non-signal through vias and does not electrically connect the contact pads. The interval between the second non-signal through via and anyone of the surrounding first non-signal through vias is smaller than or equal to 0.72 times of the minimum interval between any two of the contact pads electrically connected to the corresponding first non-signal through vias. In addition, the chip is disposed on the wiring board, located over another side of the core layer and electrically connected to the wiring board.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
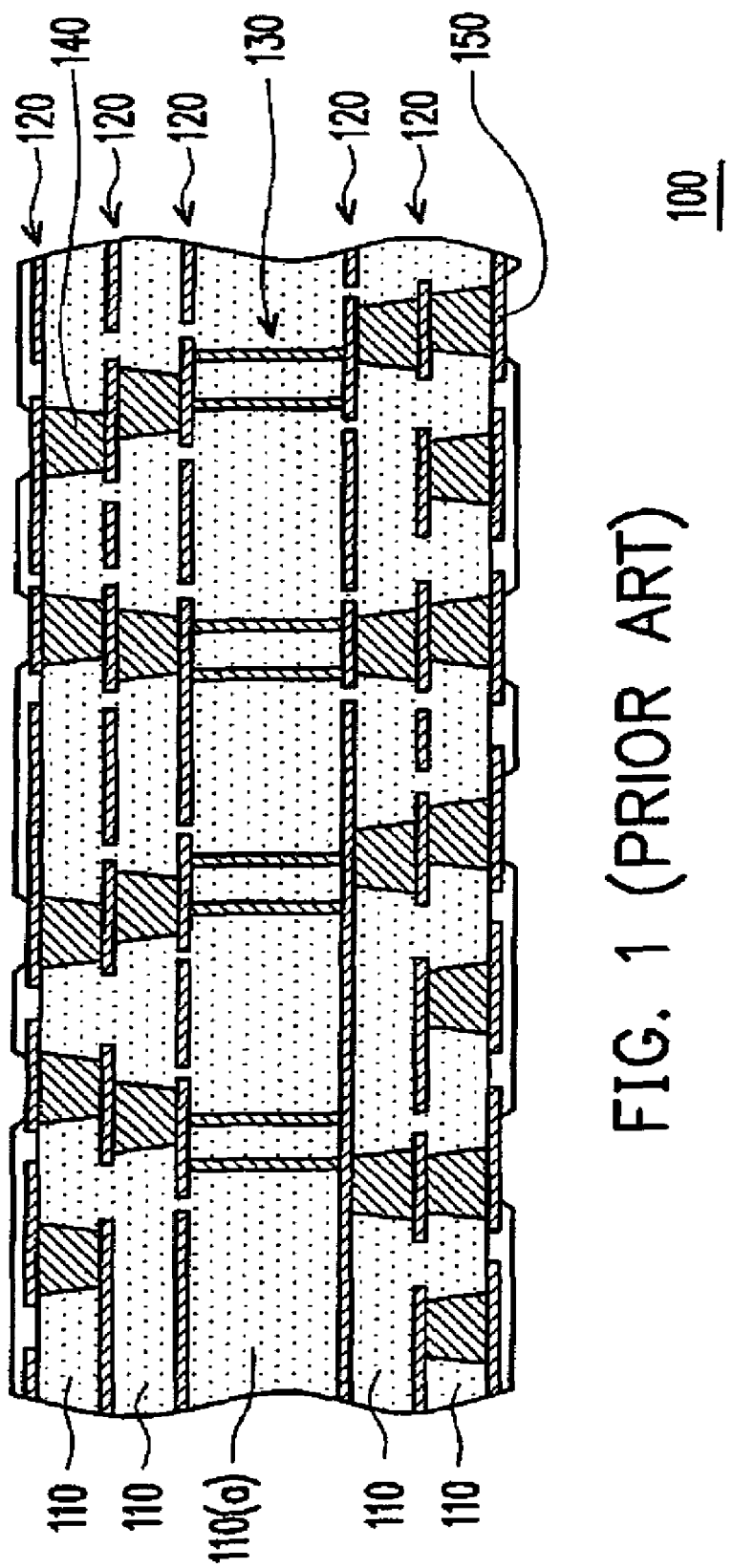
FIG. 1 is a cross-sectional view of a conventional wiring board.
Figure 2:
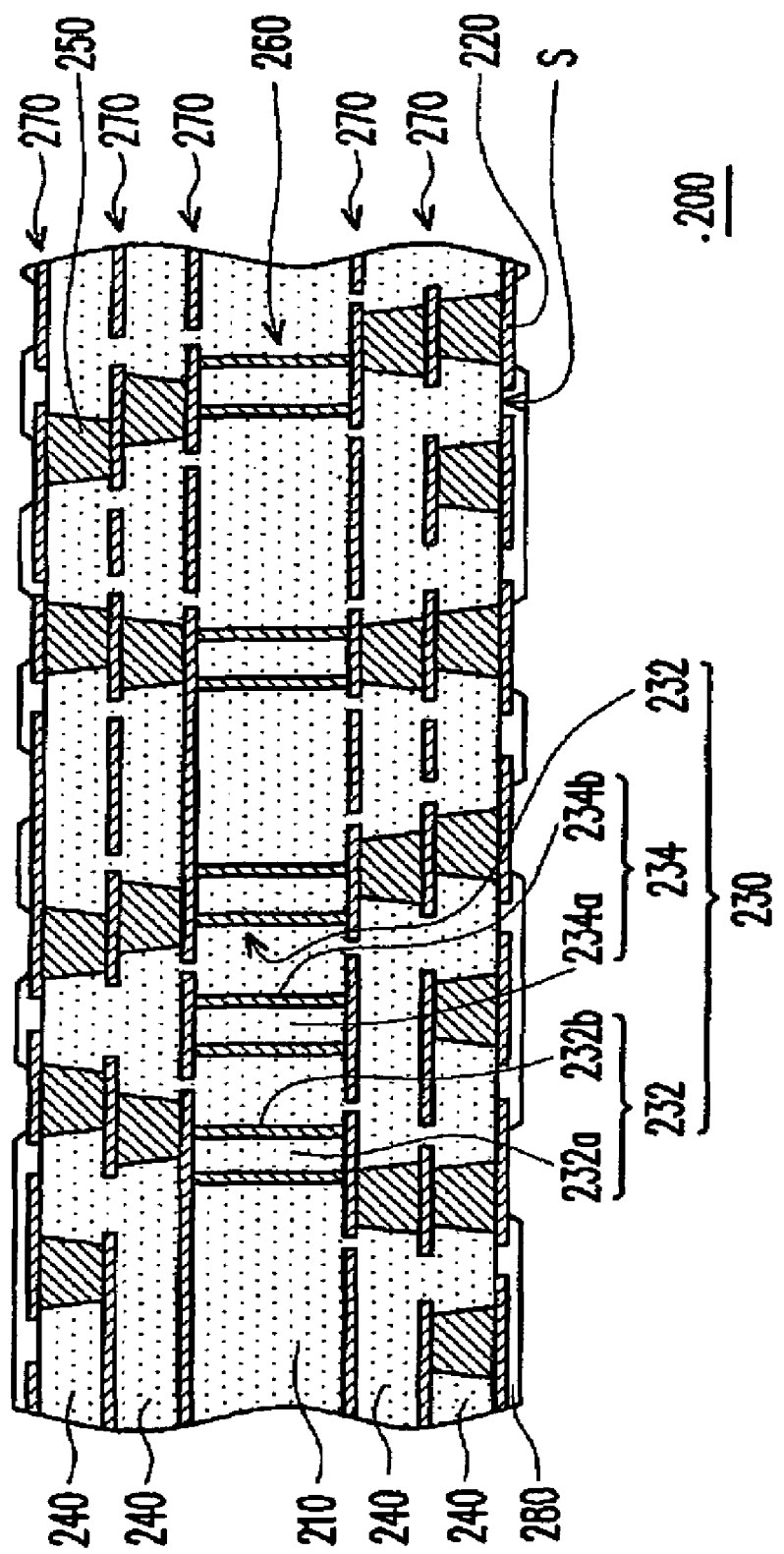
FIG. 2 is a cross-sectional view of a wiring board according to an embodiment of the present invention.
Figure 3:
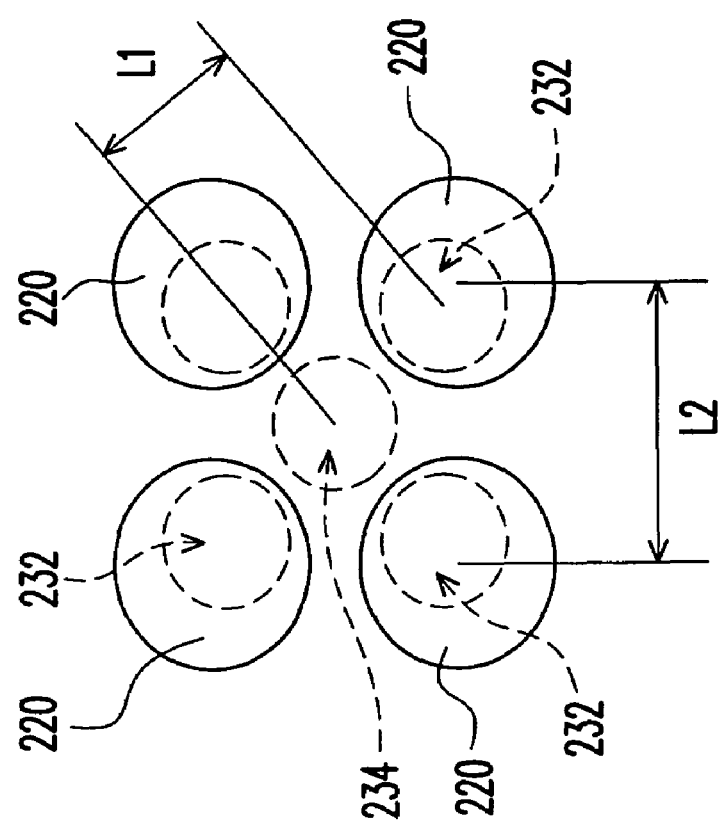
FIG. 3 is a bottom view of some of the elements in FIG. 2.

FIG. 2 is a cross-sectional view of a wiring board according to an embodiment of the present invention. FIG. 3 is a bottom view of some of the elements in FIG. 2. Referring to FIGS. 2 and 3, a wiring board 200 of the present embodiment is, for example, a circuit board or a package substrate. The wiring board 200 includes a core layer 210, a plurality of contact pads 220 and at least an arrangement of non-signal through vias 230. The contact pads 220 are disposed over a side of the core layer 210. In the embodiment, the contact pads 220 are disposed on a contact surface S of the wiring board 200 and used for electrically connecting the electronic device of the next stage (not shown).

The arrangement of non-signal through vias 230 includes a plurality of first non-signal through vias 232 and a second non-signal through via 234. Each of the first non-signal through vias 232 comprises a dielectric column 232a and a conductive layer 232b wrapping around the dielectric column 232a. Each of the second non-signal through vias 234 comprises a dielectric column 234a and a conductive layer 234b wrapping around the dielectric column 234a. The first non-signal through vias 232 pass through the core layer 210 and are electrically connected to some of the contact pads 220. The second non-signal through via 234 which passes through the core layer 210 is disposed between the first non-signal through vias 232 and does not electrically connect the contact pads 220. The interval L1 between the second non-signal through via 234 and anyone of the surrounding first non-signal through vias 232 is smaller than or equal to 0.72 times of the minimum interval L2 between any two of the contact pads 220 electrically connected to the first non-signal through vias 232. Note that FIG. 3 shows only some of the first non-signal through vias 232, the second non-signal through via 234, and some of the contact pads 220 electrically connected to the corresponding first non-signal through vias 232 in FIG. 2.

Figure 4:
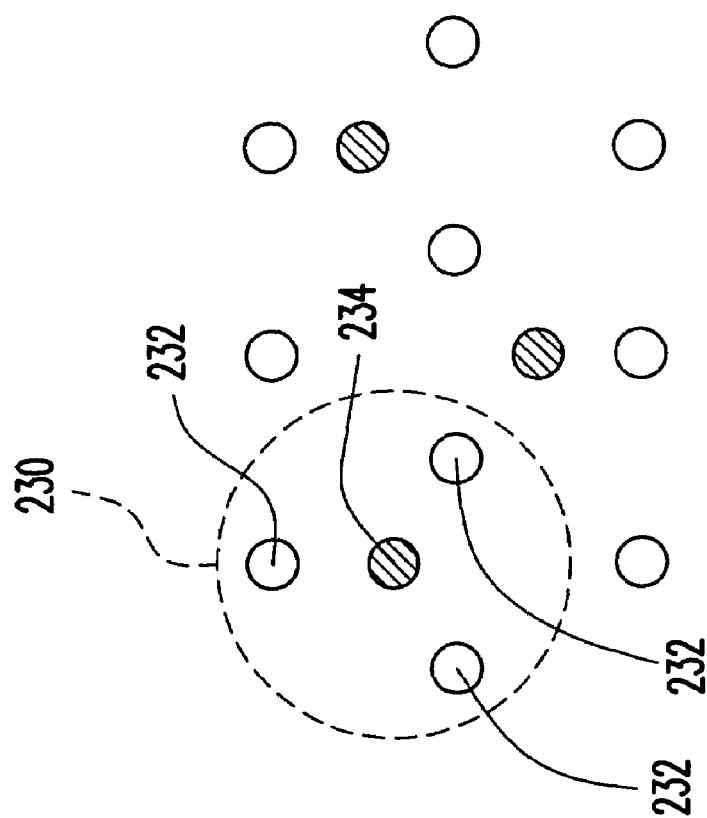
FIG. 4 shows the arrangement of non-signal through vias in FIG. 2.

The first non-signal through via 232 can be a power through via, while the second non-signal through via 234 can be a ground through via; or alternatively, the first non-signal through via 232 can be a ground through via, while the second non-signal through via 234 can be a power through via. In other words, the first non-signal through vias 232 and the second non-signal through via 234 are different kinds of through via. Referring to FIG. 4, it shows the arrangement of non-signal through vias in FIG. 2. It can be seen from FIG. 4 that in an arrangement 230 of non-signal through vias, the second non-signal through via 234 is located among between the first non-signal through vias 232.

Referring to FIGS. 2 and 3, the wiring board 200 of the embodiment is used for transmitting current by means of the first non-signal through vias 232 and the second non-signal through via 234. Because the first non-signal through vias 232 and the second non-signal through via 234 respectively belong to the different kinds, the equivalent inductance of the arrangement 230 of non-signal through vias is the result of subtracting the coupling inductance between the second non-signal through via 234 and the first non-signal through vias 232 from the sum of all the inherent inductances of the first non-signal through vias 232 and the second non-signal through via 234. In addition, since the current direction transmitted by the first non-signal through vias 232 is usually opposite to the current direction transmitted by the second non-signal through via 234, the coupling inductance between the second non-signal through via 234 and the first non-signal through vias 232 is enhanced, and the equivalent inductance of the arrangement 230 of non-signal through vias is further reduced. Therefore, the arrangement 230 of non-signal through vias of the wiring board 200 according to the embodiment produces a smaller parasitic inductance, and the noise interference occurring during switching current is accordingly reduced.

The wiring board 200 of the embodiment further includes a plurality of insulation layers 240, a plurality of conductive vias 250, a plurality of signal through vias 260, and a plurality of patterned conductive layers 270. The above-described core layer 210 is considered one of the insulation layers 240, and the material of the insulation layers 240 is, for example, flame retardant fiber glass epoxy (FR-4) or epoxy resin. Besides, each of the conductive vias 250 (consisting of a material of, for example, copper) passes through one of the insulation layers 240 except for the core layer 210, and the signal through vias 260 pass through the core layer 210. Additionally, each of the patterned conductive layers 270 is made, for example, of a copper foil defined by lithography and etching processes; the patterned conductive layers 270 and the insulation layers 240 are alternately disposed with each other. At least two of the patterned conductive layers 270 are electrically connected to each other by the first non-signal through vias 232, the second non-signal through via 234, the signal through vias 260, or at least one of the conductive vias 250. The wiring board 200 further includes a solder mask layer 280 disposed over a side of the core layer 210 (in the embodiment, the solder mask layer 280 is disposed on a contact surface S of the wiring board 200), and the solder mask layer 280 exposes the contact pads 220.

Figure 5:
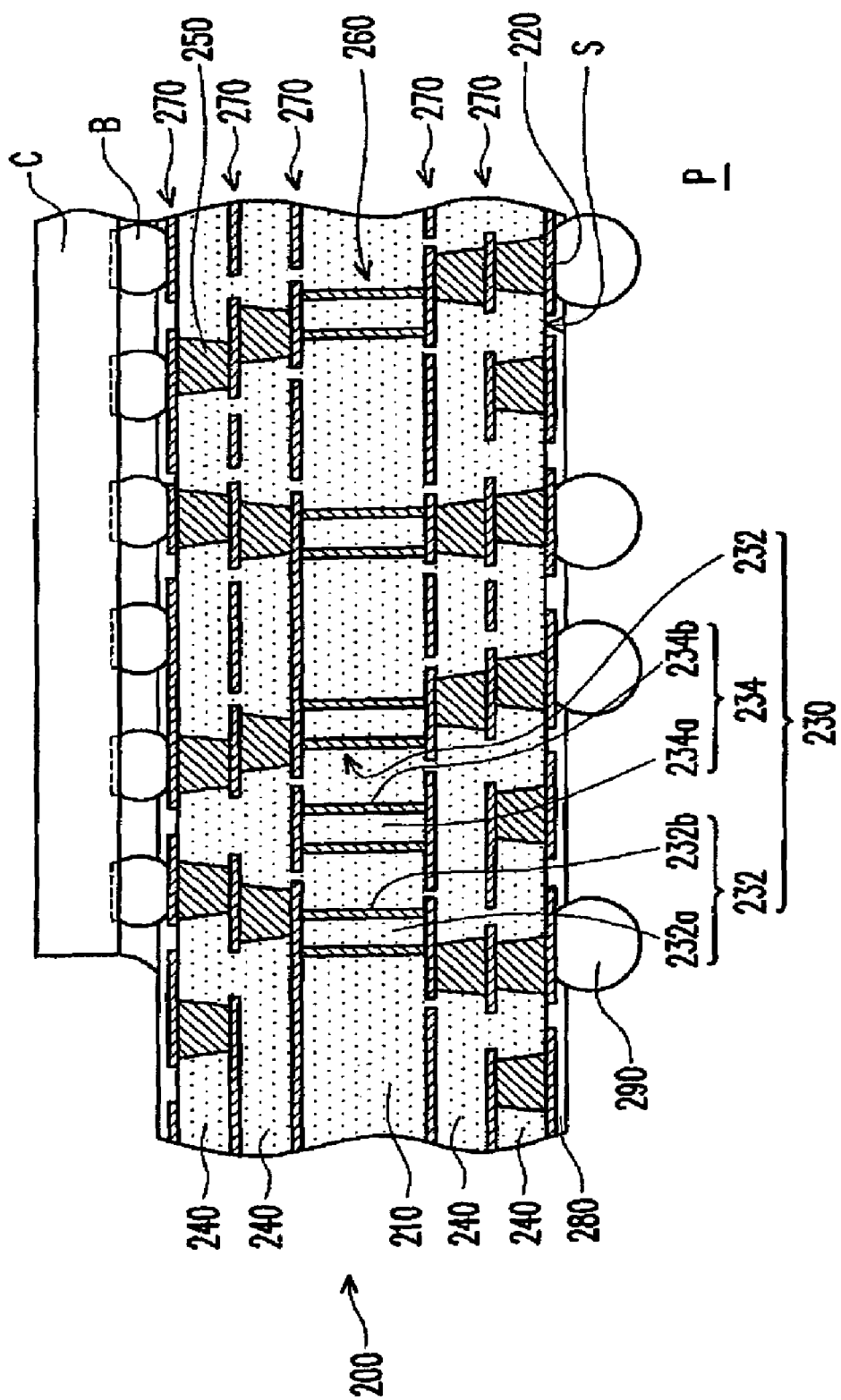
FIG. 5 is a cross-sectional view of a chip package according to another embodiment of the present invention.

Referring to FIG. 5, it is a cross-sectional view of a chip package according to another embodiment of the present invention. A chip package P of the embodiment includes a chip C and a wiring board 200 (a package substrate herein) of the above-described embodiment. The chip C is disposed on another surface of the wiring board 200 opposite to the contact surface S. In other words, the chip C and the contact pads 220 are located over two sides of the core layer 210, respectively. Besides, the chip C is electrically connected to the wiring board 200 through a plurality of bumps B, while the contact pads 220 of the wiring board 200 are electrically connected to the electronic device of the next stage (not shown) through a plurality of solder balls 290. The chip C can be electrically connected to the wiring board 200 through a plurality of bonding wires as well, which is not shown by a figure herein.

In summary, as the wiring board of the present invention transmits current through the first non-signal through vias and the second non-signal through via, since the first non-signal through vias and the adjacent second non-signal through via belong to different kinds of non-signal through vias, the arrangement of non-signal through vias of the wiring board according to the present invention produces a smaller parasitic inductance and the noise interference occurred during switching current is accordingly reduced.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An arrangement of non-signal through vias, suitable for a wiring board, wherein the wiring board has a contact surface, a core layer and a plurality of contact pads disposed on the contact surface, the arrangement comprising:
    a plurality of first non-signal through vias, passing through the core layer and electrically connected to at least one of the contact pads; and
    a second non-signal through via, passing through the core layer, disposed between the first non-signal through vias, and not electrically connected to the contact pads,
    wherein each of the first non-signal through vias and the second non-signal through via comprises a dielectric column and a conductive layer wrapping around the dielectric column, and the interval between the second non-signal through via and anyone of the surrounding first non-signal through vias is smaller than or equal to 0.72 times of the minimum interval between any two of the contact pads electrically connected to the corresponding first non-signal through vias.

2. The arrangement of non-signal through vias of claim 1, wherein the first non-signal through vias are power through vias and the second non-signal through via is a ground through via.

3. The arrangement of non-signal through vias of claim 1, wherein the first non-signal through vias are ground through vias and the second non-signal through via is a power through via.

4. The arrangement of non-signal through vias of claim 1, wherein the current direction transmitted by the first non-signal through vias is opposite to the current direction transmitted by the second non-signal through via.

5. The arrangement of non-signal through vias of claim 1, wherein the contact pads are absent above and below the second non-signal through via.

6. A wiring board, comprising:
    a core layer;
    a plurality of contact pads, disposed over the core layer; and
    at least an arrangement of non-signal through vias, comprising:
        a plurality of first non-signal through vias, passing through the core layer and electrically connected to at least one of the contact pads; and
        a second non-signal through via, passing through the core layer, disposed between the first non-signal through vias, and not electrically connected to the contact pads;
        wherein each of the first non-signal through vias and the second non-signal through via comprises a dielectric column and a conductive layer wrapping around the dielectric column, and the interval between the second non-signal through via and anyone of the surrounding first non-signal through vias is smaller than or equal to 0.72 times of the minimum interval between any two of the contact pads electrically connected to the corresponding first non-signal through vias.

7. The wiring board of claim 6, wherein the first non-signal through vias are power through vias and the second non-signal through via is a ground through via.

8. The wiring board of claim 6, wherein the first non-signal through vias are ground through vias and the second non-signal through via is a power through via.

9. The wiring board of claim 6, wherein the current direction transmitted by the first non-signal through vias is opposite to the current direction transmitted by the second non-signal through via.

10. The wiring board of claim 6, further comprising:
    a plurality of insulation layers, wherein one of the insulation layers is the core layer;
    a plurality of conductive vias, wherein each of the conductive vias passes through one of the insulation layers;
    a plurality of signal through vias, passing through the core layer; and
    a plurality of patterned conductive layers, disposed alternately with the insulation layers, wherein at least two of the patterned conductive layers are electrically connected to each other.

11. The wiring board of claim 6, wherein the wiring board is a circuit board or a package substrate.

12. The wiring board of claim 6, wherein the contact pads are absent above and below the second non-signal through via.

13. A chip package, comprising:
    a wiring board, comprising:
        a core layer;
        a plurality of contact pads, disposed over the core layer; and
        at least an arrangement of non-signal through vias, comprising:
            a plurality of first non-signal through vias, passing through the core layer and electrically connected to some of the contact pads; and
            a second non-signal through via, passing through the core layer, disposed between the first non-signal through vias, and not electrically connected to the contact pads;
            wherein each of the first non-signal through vias and the second non-signal through via comprises a dielectric column and a conductive layer wrapping around the dielectric column, and the interval between the second non-signal through via and anyone of the surrounding first non-signal through vias is smaller than or equal to 0.72 times of the minimum interval between any two of the contact pads electrically connected to the corresponding first non-signal through vias; and
    a chip, disposed on the wiring board, located over the core layer, and electrically connected to the wiring board.

14. The chip package of claim 13, wherein the first non-signal through vias are power through vias and the second non-signal through via is a ground through via.

15. The chip package of claim 13, wherein the first non-signal through vias are ground through vias and the second non-signal through via is a power through via.

16. The chip package of claim 13, wherein the current direction transmitted by the first non-signal through vias is opposite to the current direction transmitted by the second non-signal through via.

17. The chip package of claim 13, wherein the wiring board further comprising:
    a plurality of insulation layers, wherein one of the insulation layers is the core layer;
    a plurality of conductive vias, wherein each of the conductive vias passes through one of the insulation layers;
    a plurality of signal through vias, passing through the core layer; and a plurality of patterned conductive layers, disposed alternately with the insulation layers, wherein at least two of the patterned conductive layers are electrically connected to each other.

18. The chip package of claim 13, further comprising a plurality of bumps, wherein the chip is electrically connected to the wiring board through the bumps.

19. The chip package of claim 13, wherein the wiring board further comprises a solder mask layer, disposed over a side of the core layer and exposing the contact pads.

20. The chip package of claim 13, wherein the contact pads are absent above and below the second non-signal through via.

* * * * *